United States Patent
Katti

(10) Patent No.: US 8,358,154 B2
(45) Date of Patent: Jan. 22, 2013

(54) MAGNETIC LOGIC GATE

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/916,046

(22) Filed: Oct. 29, 2010

(65) Prior Publication Data

US 2012/0105101 A1  May 3, 2012

(51) Int. Cl.
*H03K 19/20* (2006.01)
*H03K 19/094* (2006.01)
*G11C 11/22* (2006.01)

(52) U.S. Cl. .................... 326/112; 326/38; 365/145

(58) Field of Classification Search ............ 326/37–41, 326/47, 104, 112, 119; 365/145, 158, 171, 365/173, 225.5, 33; 257/30, 317, 421, 422
See application file for complete search history.

(56) References Cited

U.S. PATENT DOCUMENTS

| | | | |
|---|---|---|---|
| 5,739,704 A | | 4/1998 | Clark |
| 6,034,887 A | * | 3/2000 | Gupta et al. .................. 365/171 |
| 6,050,335 A | * | 4/2000 | Parsons ...................... 166/272.3 |
| 6,343,032 B1 | | 1/2002 | Black et al. |
| 6,351,409 B1 | | 2/2002 | Rizzo et al. |
| 6,526,559 B2 | | 2/2003 | Schiefele et al. |
| 6,657,888 B1 | | 12/2003 | Doudin et al. |
| 6,809,900 B2 | | 10/2004 | Covington |
| 6,950,335 B2 | | 9/2005 | Dieny et al. |
| 6,985,318 B2 | | 1/2006 | Clinton et al. |
| 6,985,930 B2 | | 1/2006 | Oikawa |
| 7,075,807 B2 | | 7/2006 | Leuschner et al. |
| 7,096,437 B2 | | 8/2006 | Ditto et al. |
| 7,116,576 B2 | | 10/2006 | Smith et al. |
| 7,218,139 B1 | | 5/2007 | Young et al. |
| 7,241,631 B2 | | 7/2007 | Huai et al. |
| 7,267,999 B2 | | 9/2007 | Drewes |
| 7,332,781 B2 | | 2/2008 | Nozieres et al. |
| 7,379,321 B2 | | 5/2008 | Ravelosona et al. |
| 7,394,684 B2 | * | 7/2008 | Inokuchi et al. .............. 365/158 |
| 7,397,285 B2 | | 7/2008 | Agan et al. |

(Continued)

FOREIGN PATENT DOCUMENTS

EP   0 575 738 A2   12/1993

(Continued)

OTHER PUBLICATIONS

Mukherjee et al., "Switching of Composite Media by Wall Propagation," Journal of Applied Physics, vol. 99, No. 8, Apr. 15, 2006, 3 pages.

(Continued)

*Primary Examiner* — Shawki Ismail
*Assistant Examiner* — Dylan White
(74) *Attorney, Agent, or Firm* — Shumaker & Sieffert, P.A.

(57) ABSTRACT

This disclosure is directed to a magnetic logic gate for implementing a combinational logic function. The magnetic logic gate may include a write circuit configured to apply a spin-polarized current to the magnetoresistive device such that a resulting programmed magnetization state of the magnetoresistive device corresponds to a logic input value of a combinational logic function implemented by the magnetic logic device. The magnetic logic gate may further include a read circuit configured to generate a logic output value for the combinational logic function based on the programmed magnetization state in response to the write circuit applying the spin-polarized current to the magnetoresistive device.

20 Claims, 13 Drawing Sheets

U.S. PATENT DOCUMENTS

| | | | |
|---|---|---|---|
| 7,400,166 | B2 | 7/2008 | Bangert |
| 7,425,377 | B2 | 9/2008 | Fullerton et al. |
| 7,465,502 | B2 | 12/2008 | Gusliyenko |
| 7,596,018 | B2 | 9/2009 | Johnson |
| 7,630,231 | B2 | 12/2009 | Miltat et al. |
| 7,684,233 | B2 | 3/2010 | Lim et al. |
| 7,710,766 | B2 | 5/2010 | Mullner et al. |
| 7,719,881 | B2 | 5/2010 | Bangert |
| 7,825,686 | B2 | 11/2010 | Hoeink et al. |
| 7,852,665 | B2 * | 12/2010 | Chen et al. ............... 365/158 |
| 7,870,472 | B2 | 1/2011 | Thorp et al. |
| 7,940,592 | B2 * | 5/2011 | Reed et al. ............ 365/225.5 |
| 8,027,206 | B2 * | 9/2011 | Yoon et al. ............ 365/189.06 |
| 8,159,864 | B2 | 4/2012 | Yoon et al. |
| 8,208,295 | B2 * | 6/2012 | Dieny ..................... 365/171 |
| 2003/0227907 | A1 | 12/2003 | Choi et al. |
| 2004/0108561 | A1 | 6/2004 | Jeong |
| 2006/0125034 | A1 | 6/2006 | Ohba et al. |
| 2006/0145806 | A1 | 7/2006 | Kim et al. |
| 2006/0176620 | A1 | 8/2006 | Ravelosona et al. |
| 2007/0063237 | A1 | 3/2007 | Huai et al. |
| 2007/0091509 | A1 | 4/2007 | Yi et al. |
| 2007/0224454 | A1 | 9/2007 | Ingvarsson et al. |
| 2008/0100345 | A1 | 5/2008 | Bratkovski et al. |
| 2008/0150578 | A1 | 6/2008 | Kiel et al. |
| 2008/0238475 | A1 | 10/2008 | Chua-Eoan |
| 2008/0278196 | A1 | 11/2008 | Dito et al. |
| 2009/0027949 | A1 | 1/2009 | Koga et al. |
| 2009/0046501 | A1 | 2/2009 | Ranjan et al. |
| 2009/0067225 | A1 | 3/2009 | Mryasov et al. |
| 2009/0103354 | A1 | 4/2009 | Yoon et al. |
| 2009/0296462 | A1 | 12/2009 | Kent et al. |
| 2009/0317923 | A1 | 12/2009 | Sun et al. |
| 2009/0323402 | A1 * | 12/2009 | Li et al. ............... 365/158 |
| 2010/0039136 | A1 | 2/2010 | Chua-Eoan et al. |
| 2010/0078723 | A1 | 4/2010 | Bertin et al. |
| 2010/0080048 | A1 | 4/2010 | Liu et al. |
| 2010/0080054 | A1 | 4/2010 | Abe |
| 2010/0090262 | A1 | 4/2010 | Saito et al. |
| 2010/0110757 | A1 | 5/2010 | Ma et al. |
| 2010/0142260 | A1 | 6/2010 | Yoon et al. |
| 2010/0148288 | A1 | 6/2010 | Johnson |
| 2010/0194431 | A1 | 8/2010 | Chua-Eoan et al. |
| 2010/0219858 | A1 | 9/2010 | Ditto et al. |
| 2010/0315123 | A1 | 12/2010 | Niemier et al. |
| 2011/0006807 | A1 | 1/2011 | Schneiderwind |
| 2011/0007558 | A1 | 1/2011 | Mryasov et al. |
| 2011/0026336 | A1 * | 2/2011 | Huang et al. ............ 365/189.14 |
| 2012/0014166 | A1 | 1/2012 | Ma et al. |
| 2012/0081950 | A1 | 4/2012 | Slaughter |

FOREIGN PATENT DOCUMENTS

| | | |
|---|---|---|
| EP | 2 172 969 A1 | 4/2010 |
| WO | 2010/029326 A1 | 3/2010 |
| WO | 2010024126 A1 | 3/2010 |

OTHER PUBLICATIONS

Lybertatos et al., "Thermal Effects in the High-Speed Switching of the Magnetization of Fine Grains," Published in Intermag Europe 2002 Digest of Technical Papers, 2002 IEEE International Magnetics Conference, Apr. 28-May 2, 2002, 1 page.

Office Action dated Jun. 23, 2011, for U.S. Appl. No. 12/916,174, 10 pages.

Responsive Amendment dated Sep. 23, 2011 for U.S. Appl. No. 12/916,174, 12 pages.

S. Matsunaga et al., "MTJ-Based Nonvolatile Logic-In-Memory Circuit, Future Prospects and Issues," Apr. 20-24, 2009, 3 pages, retrieved from http://www.date-conference.com/proceedings/PAPERS/2009/DATE09/PDFFILES/05.2_1.PDF.

Y. Nozaki et al., "Size Dependence of Switching Current and Energy Barrier in the Magnetization Reversal of Rectangular Magnetic Random Access Memory Cell," Journal of Applied Physics, vol. 93, No. 10, 3 pages, May 15, 2003.

Lybertatos et al., "Thermal Effects in the High-Speed Switching of the Magnetization of Fine Gains," Published in Intermag Europe 2002 Digest of Technical Papers, 2002 IEEE International Magnetics Conference, Apr. 28-May 2, 2002. Abstract only, retrieved from the internet at http ://sciencelinks.jp/j-east/article/200312/000020031203A0344537.php.

Mukherjee et al., "Switching of Composite Media by Wall Propagation," Published in Journal of Applied Physics, vol. 99, No. 8, Apr. 15, 2006. Citation retrieved from DialogWeb. Abstract retrieved from the Internet at http://jap.aip.org/japiau/v99/i8/p08q909_s1?isAuthorized=no.

M. Caruso et al., "A New Prospective on Magnetic Field Sensing," 19 pgs., May 1998 downloaded from http://www.ssec.honeywell.com/magnetic/datasheets/new_pers.pdf.

G. A. Prinz, "Magnetoelectronics Applications," Journal of Magnetism and Magnetic Materials 200, pp. 57-68, 1999.

R. Katti, "Magnetic Logic Gate", filed Oct. 29, 2010.

R. Katti, "Magnetic Logic Gate," filed Oct. 29, 2010.

R. Katti, "Reduced Switching-Energy Magnetic Elements," filed Oct. 29, 2010.

Office Action from U.S. Appl. No. 12/916,174, dated Nov. 10, 2011, 14 pp.

Response to Office Action dated Nov. 10, 2011, from U.S. Appl. No. 12/916,174, filed Jan. 10, 2012, 12 pp.

Notice of Allowance dated May 11, 2012, for U.S. Appl. No. 12/916,119, 16 pages.

Office Action dated Jul. 10, 2012, for U.S. Appl. No. 13/161,070, 8 pages.

Li et al., "Ultrahigh-Speed Reconfigurable Logic Gates Based on Four-Wave Mixing in a Semiconductor Optical Amplifier," IEEE Photonics Technology Letters, vol. 18, No. 12, Jun. 15, 2006, 3 pages.

Advisory Action dated Jan. 31, 2012, for U.S. Appl. No. 12/916,174, 3 pages.

Notice of Appeal dated Feb. 9, 2012, for U.S. Appl. No. 12/916,174, 1 page.

Pre-Appeal Brief Request for Review dated Feb. 9, 2012, for U.S. Appl. No. 12/916,174, 5 pages.

Notice of Panel Decision from Pre-Appeal Brief Review dated Mar. 14, 2012, for U.S. Appl. No. 12/916,174, 2 pages.

Office Action dated Jun. 6, 2012, for U.S. Appl. No. 12/916,174, 10 pages.

* cited by examiner

140

| LOGIC INPUT VALUE | WRITE CURRENT | RESISTANCE | $I_{READ}$ | LOGIC OUTPUT VALUE |
|---|---|---|---|---|
| LOGIC 0 | POL-0 | HIGH | LOW | LOGIC 0 |
| LOGIC 1 | POL-1 | LOW | HIGH | LOGIC 1 | ns
MAGNETIC LOGIC GATE

This disclosure relates to logic gates, and more particularly, to magnetic logic gates.

BACKGROUND

Logic gates are fundamental to the design and implementation of integrated circuits and computer processors. One process technology that is commonly used to implement logic gates is a Complementary Metal-Oxide-Semiconductor (CMOS) process technology. In a typical CMOS implementation, a logic gate may be implemented by using a set of n-type metal oxide semiconductor field effect transistors (MOSFETs) along with a complementary set of p-type MOSFETs. Each logic gate typically has at least one n-type MOSFET and at least one p-type MOSFET associated with each logic input of the logic function. The MOSFETs are configured such that the output of the logic gate is pulled-up to a high voltage level or pulled-down to a low voltage level depending on the input values of the logic function.

SUMMARY

This disclosure is directed to a magnetic logic gate for implementing a combinational logic function. The magnetic logic gate may include a magnetoresistive device to store an input logic value for the combinational logic function. In some examples, the magnetoresistive device may be implemented as a giant magnetoresistance (GMR) device, a magnetic tunnel junction (MTJ) device, and/or a tunneling magnetoresistance (TMR) device. The magnetic logic gate may program a magnetization state of the magnetoresistive device based on the input value for a logic function, and generate a logic output based the programmed magnetization state. The magnetic logic gate may include a write circuit that uses spin-polarized current to program the magnetization state of the logic gate. The spin direction of the spin-polarized current may correspond to a logic input value of the logic function.

According to one example, a magnetic logic device includes a magnetoresistive device. The magnetic logic device further includes a write circuit configured to apply a spin-polarized current to the magnetoresistive device such that a resulting programmed magnetization state of the magnetoresistive device corresponds to a logic input value of a combinational logic function implemented by the magnetic logic device. The magnetic logic device further includes a read circuit configured to generate a logic output value for the combinational logic function based on the programmed magnetization state in response to the write circuit applying the spin-polarized current to the magnetoresistive device.

According to another example, a method includes applying a spin-polarized current to the magnetoresistive device such that a resulting programmed magnetization state of the magnetoresistive device corresponds to a logic input value of a combinational logic function. The method further includes generating a logic output value for the combinational logic function based on the programmed magnetization state in response to applying the spin-polarized current to the magnetoresistive device.

According to another example, a magnetic logic device includes a magnetoresistive device. The magnetic logic device further includes a control unit configured to cause a write circuit to apply a spin-polarized current to the magnetoresistive device such that a resulting programmed magnetization state of the magnetoresistive device corresponds to a logic input value of a combinational logic function implemented by the magnetic logic device, and to cause, in response to causing the write circuit to apply the spin-polarized current, a read circuit to generate a logic output value for the combinational logic function based on the programmed magnetization state.

The details of one or more examples are set forth in the accompanying drawings and the description below. Other features, objects, and advantages will be apparent from the description and drawings, and from the claims.

DETAILED DESCRIPTION

This disclosure is directed to a magnetic logic gate for implementing a combinational logic function. The magnetic logic gate may include a magnetoresistive device to store an input logic value for the combinational logic function. In some examples, the magnetoresistive device may be implemented as a giant magnetoresistance (GMR) device, a magnetic tunnel junction (MTJ) device, and/or a tunneling magnetoresistance (TMR) device. The magnetic logic gate may program a magnetization state of the magnetoresistive device based on the input value for a logic function, and generate a logic output based the programmed magnetization state. The magnetic logic gate may include a write circuit that uses spin-polarized current to program the magnetization state of the logic gate. The spin direction of the spin-polarized current may correspond to a logic input value of the logic function.

The techniques described herein may be able to produce integrated circuits having lower power consumption and/or increased chip density in comparison to integrated circuits that implement equivalent logic using a CMOS process technology. In contrast to transistor-based CMOS logic gates, the magnetic logic gates designed in accordance with this disclosure may be non-volatile, i.e., such gates may retain their state even if the logic gate is not receiving power. In addition, the techniques in this disclosure may be able to be monolithically integrated with conventional CMOS electronics.

Figure 1:
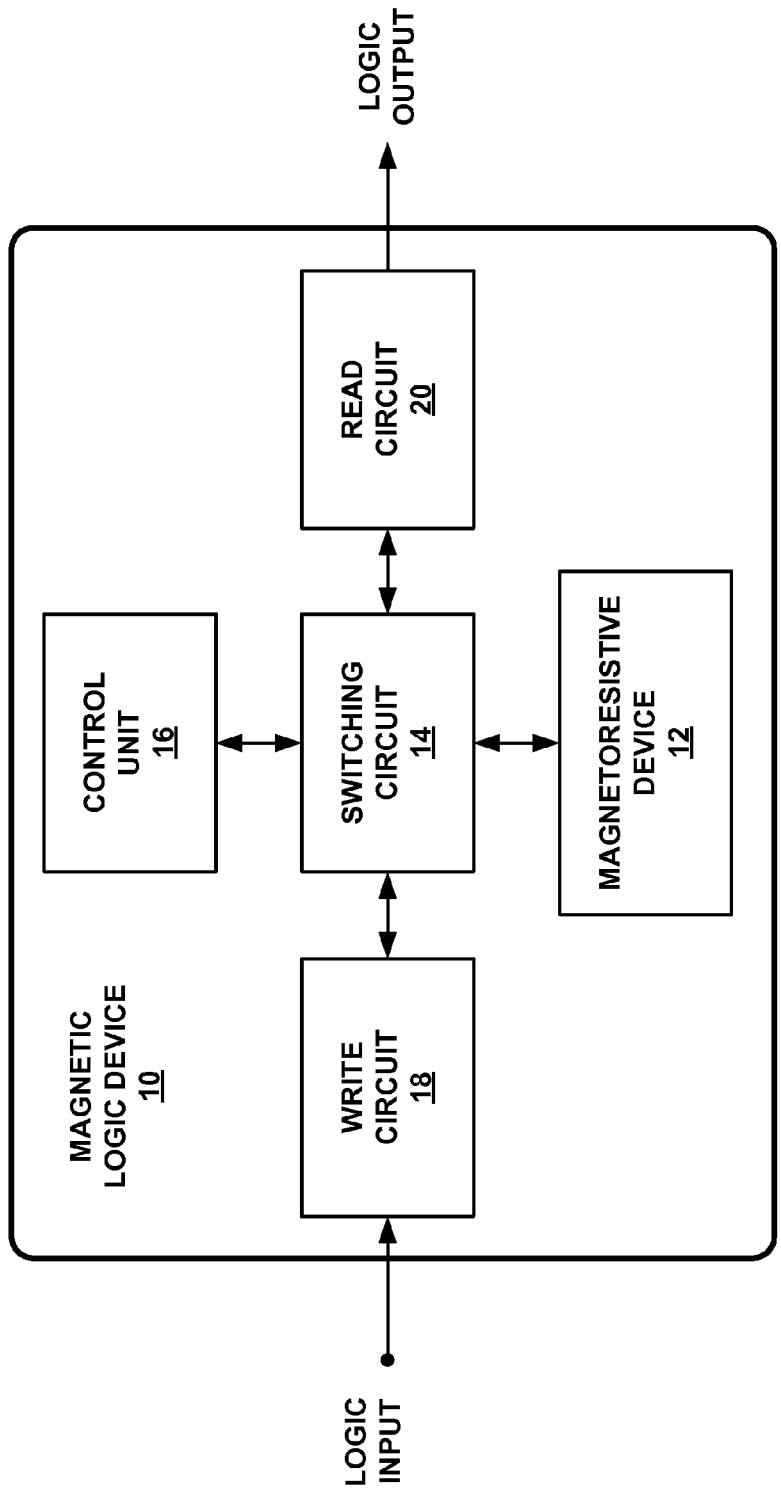
FIG. 1 is a block diagram illustrating an example magnetic logic device according to this disclosure.

FIG. 1 is a block diagram illustrating an example magnetic logic device 10 according to this disclosure. Magnetic logic device 10 is configured to receive a logic input value, and generate a logic output value in response to receiving the logic input value. Magnetic logic device 10 may perform a logic operation on the logic input value to generate the logic output value, such as, e.g., applying a combinational logic function to the logic input value to generate the logic output value. Magnetic logic device 10 may also be referred to herein as a "magnetic logic gate." Magnetic logic device 10 includes a magnetoresistive device 12, a switching circuit 14, a control unit 16, a write circuit 18, and a read circuit 20.

Magnetoresistive device 12 is configured to store a binary value as a magnetization state within magnetoresistive device 12, and to vary the resistance between two terminals of magnetoresistive device 12 based on the magnetization state of magnetoresistive device 12. Because of the magnetization state-dependant resistance of magnetoresistive device 12, when a voltage is applied across the terminals of magnetoresistive device 12, a current may propagate through magnetoresistive device 12 having a magnitude that is indicative of the magnetization state of magnetoresistive device 12.

Magnetoresistive device 12 may operate in a parallel magnetization state or an anti-parallel magnetization state. If magnetoresistive device 12 is operating in a parallel magnetization state, then magnetoresistive device 12 may have a relatively low resistance between the terminals of magnetoresistive device 12. Thus, the parallel magnetization state of magnetoresistive device 12 may be alternatively referred to herein as a "low resistance state." Similarly, if magnetoresistive device 12 is operating in an anti-parallel magnetization state, then magnetoresistive device 12 may have a relatively high resistance between the terminals of magnetoresistive device 12. As such, the anti-parallel magnetization state of magnetoresistive device 12 may be alternatively referred to herein as a "high resistance state."

Magnetoresistive device 12 may be any device capable of storing a binary logic value as one of at least two different magnetization states. In some examples, magnetoresistive device 12 may be a magnetoresistive sandwich device having two outer ferromagnetic layers and an intermediate layer formed between the two outer ferromagnetic layers. For example, magnetoresistive device 12 may be a giant magnetoresistance (GMR) device, and the intermediate layer may be a non-ferromagnetic conductive layer. In further examples, magnetoresistive device 12 may be a magnetic tunnel junction (MTJ) device or a tunneling magnetoresistance (TMR) device, and the intermediate layer may be an insulating barrier layer.

Magnetoresistive device 12 may be electrically coupled to switching circuit 14. Depending on the state of switching circuit 14, magnetoresistive device 12 may also be electrically coupled to write circuit 18 and/or read circuit 20.

Switching circuit 14 is configured to switch magnetic logic device 10 magnetoresistive device 12 between a write configuration and a read configuration depending on the current operating state of magnetic logic device 10. In some examples, switching magnetic logic device 10 between a write configuration and a read configuration may include switching magnetoresistive device 12 between a write configuration and a read configuration. Switching circuit 14 may switch magnetoresistive device 12 to a particular configuration (e.g., a write configuration or a read configuration) based on control information (e.g., a control signal) received from control unit 16.

In some examples, switching circuit 14 may switch magnetic logic device 10 into a write configuration by coupling write circuit 18 to magnetoresistive device 12, and in some examples, decoupling read circuit 20 from magnetoresistive device 12. Switching circuit 14 may switch magnetic logic device 10 into a read configuration by coupling read circuit 20 to magnetoresistive device 12, and in some examples, decoupling write circuit 18 from magnetoresistive device 12. In additional examples, switching circuit 14 may switch magnetic logic device 10 into a write configuration by powering-up write circuit 18 and powering-down read circuit 20. Similarly, switching circuit 14 may switch magnetic logic device 10 into a read configuration by powering-down write circuit 18 and powering-up read circuit 20.

Switching circuit 14 may be electrically coupled to write circuit 18, read circuit 20, and/or magnetoresistive devices 12. Switching circuit 14 may also be communicatively coupled to control unit 16.

Control unit 16 is configured to control the operation of magnetic logic device 10. In some examples, control unit 16 may be configured to cause write circuit 18 to apply a spin-polarized current to magnetoresistive device 12 such that a resulting programmed magnetization state of magnetoresistive device 12 corresponds to a logic input value of a combinational logic function implemented by magnetic logic device 10, and to cause, in response to causing write circuit 18 to apply the spin-polarized current, read circuit 20 to generate a logic output value for the combinational logic function based on the programmed magnetization state of magnetoresistive device 12.

Control unit 16 may provide control information to switching circuit 14 for controlling the configuration of magnetic logic gate 10. For example, control unit 16 may be implemented, in some examples, as a state machine having two or more states. When control unit 16 is within a first operating state (e.g., a "Write" state), control unit 16 may provide control information to switching circuit 14 directing switching circuit 14 to switch magnetic logic device 10 into a write configuration. When control unit 16 is within a second state (e.g., a "Read" state), control unit 16 may provide control information to switching circuit 14 directing switching circuit 14 to switch magnetic logic device 10 into a read configuration.

In some examples, magnetic logic device 10 may transition from the first state to the second state as part of the performance of a single logic operation, i.e., as part of the generation of a logic output value for a single logic input value.

Automatically transitioning from the first state to the second state may, in some examples, refer to transitioning from the first to the second state based on an internal clock signal. Automatically transitioning from the first state to the second state may, in additional examples, refer to transitioning from the first to the second state based on a timing signal received from a device external to magnetic logic device 10 that directs control unit 16 to initiate the transition from one state to another state. Automatically transitioning from the first state to the second state may include automatically transitioning to one or more intermediate states between the first state and the second state.

Control unit 16 may be configured, in some examples, to transition to a third state (e.g., an "Idle" state) between logic operations and/or in response to a signal received from an device external to magnetic logic device 10. In such examples, control unit 16 may transition from the third state (e.g., "Idle" state) to the first state (e.g., "Write" state) in response to receiving an external signal directing magnetic logic gate 10 to initiate the performance of a logic operation.

The control information provided by control unit 16 may be indicative of the current operating state of control unit 16. For example, the control information may take the form of a combination of one or more bits with each bit combination corresponding to a respective state within control unit 16.

In some examples, control unit 16 may be implemented as a state machine. In further examples, control unit 16 may route an external control input directly to switching circuit 14 without additional circuitry. In such examples, an external device that generates the external control input may control the current state of switching circuit 14. Control unit 16 is communicatively coupled to switching circuit 14.

Write circuit 18 is configured to receive a logic input value for a combinational logic function, and to program magnetoresistive device 12 such that a resulting programmed magnetization state of the magnetoresistive device corresponds to the logic input value of the combinational logic function. Write circuit 18 is electrically coupled to switching circuit 14 and to a logic input terminal of magnetic logic gate 10. In addition, when magnetic logic gate 10 has been switched into a write configuration, write circuit 18 may also be electrically coupled to magnetoresistive device 12.

According to this disclosure, write circuit 18 may generate a spin-polarized current having a spin direction that corresponds to the logic input value of the combinational logic function. For example, write circuit 18 may generate a spin-polarized current having a first spin direction (e.g., a spin-down direction) when the logic input value is a logic zero (i.e., a binary "0"). Similarly, write circuit 18 may generate a spin-polarized current having a second spin direction (e.g., a spin-up direction) when the logic input value is a logic one (i.e., a binary "1"). The second spin direction may be a spin direction that is opposite that of the first spin direction. Write circuit 18 may use one or more direction-specific spin filters to generate the spin-polarized current.

Write circuit 18 may apply the spin-polarized current to magnetoresistive device 12 to program the magnetization state of magnetoresistive device 12 such that a resulting programmed magnetization state of magnetoresistive device 12 corresponds to the logic input value of the combinational logic function. In some examples, write circuit 18 may apply the spin-polarized current to a first terminal of magnetoresistive device 12 that is electrically coupled to a free ferromagnetic layer of magnetoresistive device 12. In other examples, write circuit 18 may apply the spin-polarized current to a second terminal of magnetoresistive device 12 that is electrically coupled to a pinned ferromagnetic layer of magnetoresistive device 12. In any case, the application of the spin-polarized current to magnetoresistive device 12 programs the magnetization state of magnetoresistive device 12 to one of two magnetization states based on the spin direction of the spin polarized current.

Read circuit 20 is configured to generate a logic output value for the combinational logic function implemented by magnetic logic device 10 based on the programmed magnetization state of magnetoresistive device 12. In some examples, read circuit 20 may be configured to apply a bias voltage across magnetoresistive device 12, which may induce a read current to propagate through magnetoresistive device 12. Read circuit 20 may measure the magnitude of the read current, which is indicative of the programmed magnetization state of magnetoresistive device 12, and generate a logic output value for the combinational logic function based on the measured current. In some examples, read circuit 20 may map the read current magnitude to a corresponding logic output value to generate a logic output value for the logic function.

Read circuit 20 may include voltage sources, current measurement devices, operational amplifiers, transimpedance amplifiers, comparators, digital-to-analog converters, and/or other circuitry configured to generate a read current and map the read current magnitude to a logic output value.

Read circuit 20 is electrically coupled to switching circuit 14. In addition, when magnetic logic gate 10 has been switched into a read configuration, read circuit 18 may also be electrically coupled to magnetoresistive device 12.

The operation of magnetic logic gate 10 will now be described. Control unit 16 initiates a logic operation by transitioning to a first state (e.g., a "Write" state). When operating in the first state, control unit 16 causes magnetic logic device 10 to operate in a write configuration. For example, control unit 16 may provide control information to switching circuit 14 directing switching circuit 14 to switch magnetic logic device 10 into a write configuration.

Upon receiving the control information from control unit 16, switching circuit 14 switches magnetic logic device 10 into a write configuration. For example, switching circuit 14 may couple write circuit 18 to magnetoresistive device 12.

Write circuit 18 receives a logic input value for a combinational logic function and generates a spin-polarized current having a spin-direction corresponding to the logic input value. When magnetic logic device 10 is operating in a write configuration, write circuit 18 applies the spin-polarized current to magnetoresistive device 12 to program magnetoresistive device 12 such that a resulting programmed magnetization state of the magnetoresistive device 12 corresponds to the logic input value.

For example, if the logic input value is a logic zero, write circuit 18 may generate a spin-polarized current having a first spin direction (e.g., a spin-down spin direction), which when applied to magnetoresistive device 12, causes the magnetization state to be programmed to a first magnetization state (e.g., an anti-parallel magnetization state). Similarly, if the logic input value is a logic one, write circuit 18 may generate a spin-polarized current having a second spin direction (e.g., a spin-up spin direction), which when applied to magnetoresistive device 12, causes the magnetization state to be programmed to a second magnetization state (e.g., a parallel magnetization state).

After the magnetization state has been programmed to correspond to the logic input value, control unit 16 transitions from the first state (e.g., the "Write" state) to the second state (e.g., the "Read" state). In some examples, control unit 16 may transition to the second state in response to an external timing signal. In further examples, control unit 16 may automatically transition to the second state after a predetermined period of time. When operating in the second state, control unit 16 causes magnetic logic device 10 to switch from operating in the write configuration to operating in a read configuration. For example, in response to operating in the write configuration, control unit 16 may provide control information to switching circuit 14 directing switching circuit 14 to switch magnetic logic device 10 from the write configuration to a read configuration.

Upon receiving the control information from control unit 16, switching circuit 14 switches magnetic logic device 10 into a read configuration. For example, switching circuit 14 may decouple write circuit 18 from magnetoresistive device 12, and couple read circuit 20 to magnetoresistive device 12.

Read circuit 20 generates a logic output value for the combinational logic function implemented by magnetic logic device 10 based on the programmed magnetization state of magnetoresistive device 12. For example, read circuit 20 may apply a voltage across magnetoresistive device 12, which causes a read current to propagate through magnetoresistive device 12. The read current propagating through magnetoresistive device 12 varies depending on the programmed magnetization state of magnetoresistive device 12. In this example, read circuit 20 may measure the level of current propagating through magnetoresistive device 12 and generate an logic output value based on the measured level of current.

For example, if magnetoresistive device 12 is programmed to a low resistance state (i.e., a parallel magnetization state), then the read current propagating through magnetoresistive device 12 may have a relatively high magnitude and be referred to herein as a "high read current." Read circuit 20 may map the high level of current to a first logic value (e.g., logic "1"). Similarly, if magnetoresistive device 12 is programmed to a high resistance state (i.e., an anti-parallel magnetization state), then the read current propagating through magnetoresistive device 12 may have a relatively low magnitude and be referred to herein as a "low read current." Read circuit 20 may map the low level of current to a second logic value (e.g., logic "0"). The logic operation is now complete.

After completing the logic operation, control unit 16 may, in some examples, transition from the second state (e.g., the "Read" state) to the first state (e.g., the "Write" state) to commence performance of a subsequent logic operation. In additional examples, control unit 16 may transition to a third state (e.g., the "Idle" state) to wait until control unit 16 receives instructions from an external device to commence another logic operation.

Figure 2A:
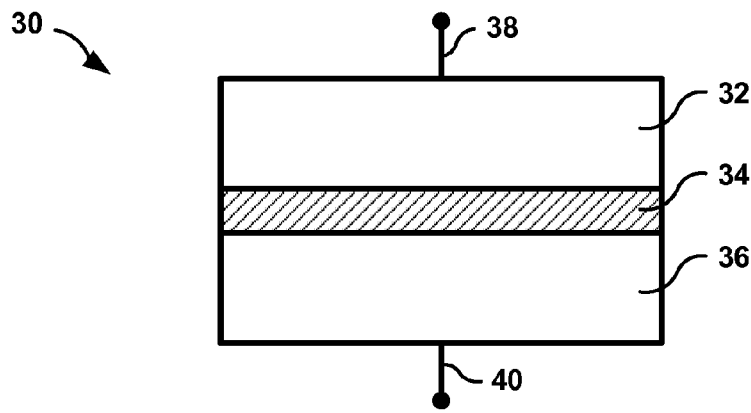
FIG. 2A is a conceptual diagram illustrating an example magnetoresistive device according to this disclosure for use within the magnetic logic device of FIG. 1.

FIG. 2A is a conceptual diagram illustrating an example magnetoresistive device 30 according to this disclosure for use within the logic gate device of FIG. 1. Magnetoresistive device 30 is configured to vary a terminal-to-terminal resistance based on a magnetization state of the magnetoresistive device. Magnetoresistive device 30 may also be configured to receive a spin-polarized current and to transition or remain in a magnetization state corresponding to the spin direction of the spin-polarized current. In addition, magnetoresistive device 30 may be configured to receive an applied voltage across the terminals of magnetoresistive device 30 and generate a read current having a magnitude that is indicative of the magnetization state of magnetoresistive device 30 in response to the applied voltage. Magnetoresistive device 30 includes a free layer 32, an intermediate layer 34, a fixed layer 36, and terminals 38, 40.

Free layer 32 includes ferromagnetic materials, such as, e.g., nickel, iron, cobalt, binary and ternary alloys of Ni, Fe, and Co, permalloys, or any other material that has ferromagnetic properties. Fixed layer 36 includes ferromagnetic materials, such as, e.g., nickel, iron, cobalt, nickel alloys, iron alloys, cobalt alloys, permalloys, or any other material that has ferromagnetic properties. Antiferromagnetic materials may also be applied, such as iron manganese and other manganese alloys. In some examples, free layer 32 and fixed layer 36 may include thin-film ferromagnetic materials. Although free layer 32 and fixed layer 36 are described in the example magnetoresistive device 30 of FIG. 2A as including ferromagnetic materials, in other examples, one or more of free layer 32 and fixed layer 36 may include ferrimagnetic materials in addition to or in lieu of the ferromagnetic materials.

Free layer 32 is configured to have a magnetization direction that can be altered by application of a spin-polarized current to one or both of terminals 38, 40. Fixed layer 36 is configured to have a magnetization direction that is substantially fixed during the performance of logic operations. Fixed layer 36 may alternatively be referred to as a pinned layer.

In order to achieve the desired behaviors for free layer 32 and fixed layer 36, a first type of ferromagnetic material may be selected for free layer 32, and a second type of ferromagnetic material may be selected for fixed layer 36. For example, the ferromagnetic material selected for fixed layer 36 may require a higher magnitude of spin-polarized current to alter the magnetization direction of the material than the magnitude of spin-polarized current required to alter the magnetization direction of the ferromagnetic material selected for free layer 32. As another example, the ferromagnetic material selected for fixed layer 36 may require a higher device temperature to alter the magnetization direction of the material than the device temperature required to alter the magnetization direction of the ferromagnetic material selected for free layer 32.

Intermediate layer 34 is disposed between free layer 32 and fixed layer 36. In some examples, magnetoresistive device 30 may take the form of a giant magnetoresistance (GMR) device. In such examples, intermediate layer 34 may be referred to as a non-ferromagnetic conductive layer or a non-ferromagnetic spacer layer. The non-ferromagnetic layer may include non-ferromagnetic conductor materials, such as, e.g., copper, chromium, aluminum, respective alloys of the preceding metals, or the like.

In additional examples, magnetoresistive device 30 may take the form of a magnetic tunnel junction (MTJ) device and/or a tunneling magnetoresistance (TMR) device. In such examples, intermediate layer 34 may be referred to as an insulating layer or a tunnel barrier layer. The insulating layer may include insulating materials, such as, e.g., aluminum oxide, magnesium oxide, other types of oxides, a nitride, or any other material having insulating properties.

Terminal 38 is electrically coupled to free layer 32, and in some examples, may be in direct contact with free layer 32. Terminal 40 is electrically coupled to fixed layer 36, and in some examples, may be in direct contact with fixed layer 36. As used herein, terminal 38 may be referred to as a "free layer terminal" and terminal 40 may be referred to as a "fixed layer terminal."

As used herein, the magnetization state of magnetoresistive device 30 may refer to whether the device is configured in a parallel magnetization state or an anti-parallel magnetization state. The magnetization state of magnetoresistive device 30 is defined by the relative orientation of the magnetization directions of free layer 32 and fixed layer 36. The magnetization direction of each of free layer 32 and fixed layer 36 may refer to the direction of the magnetic moment of the ferromagnetic material for the respective layer. When the magnetization directions (i.e., magnetic moments) of free layer 32 and fixed layer 36 are aligned in the same direction, then magnetoresistive device 30 is said to be in a parallel magnetization state, or alternatively, a low resistance state. When the magnetization directions (i.e., magnetic moments) of free layer 32 and fixed layer 36 are oriented in opposite directions (i.e., not aligned in the same direction), then magnetoresistive device 30 is said to be in an anti-parallel magnetization state, or alternatively, a high resistance state.

Figure 2B:
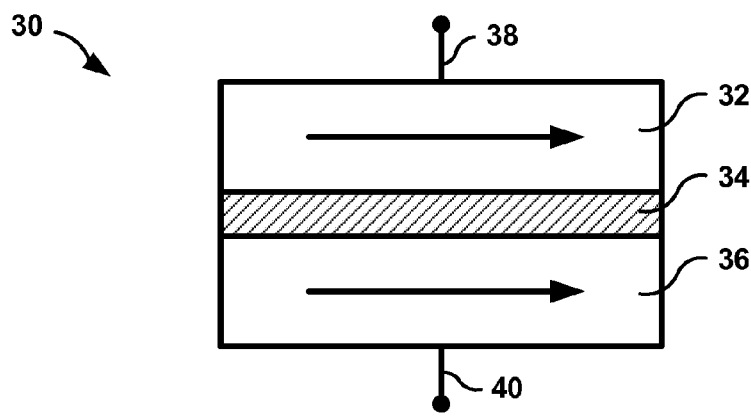
FIG. 2B is a conceptual diagram illustrating the example magnetoresistive device of FIG. 2A in a parallel magnetization state according to this disclosure.

FIG. 2B is a conceptual diagram illustrating the example magnetoresistive device 30 of FIG. 2A in a parallel magnetization state according to this disclosure. In FIG. 2B, free layer 32 and fixed layer 36 each have an arrow representative of the magnetization direction of the layers. As shown in FIG. 2B, the arrows point in the same direction representing that the magnetization direction of free layer 32 is the same as the magnetization direction of fixed layer 36, which means that magnetization device is in a parallel magnetization state.

Figure 2C:
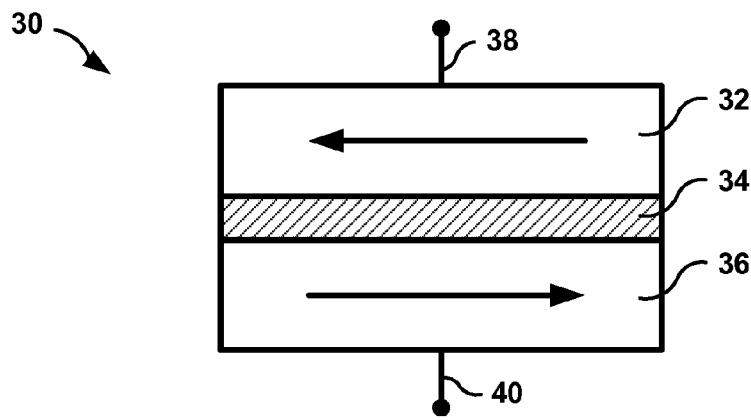
FIG. 2C is a conceptual diagram illustrating the example magnetoresistive device of FIG. 2A in an anti-parallel magnetization state according to this disclosure.

FIG. 2C is a conceptual diagram illustrating the example magnetoresistive device of FIG. 2A in an anti-parallel magnetization state according to this disclosure. FIG. 2C includes arrow representative of the magnetization direction of the layers similar to that depicted in FIG. 2B except that the arrows are oriented in opposite directions, which means the that magnetization device is in an anti-parallel magnetization state.

If magnetoresistive device 30 is a GMR device, then a parallel magnetization state may cause less electron scattering at the interfaces and longer mean free paths for the electrons as compared to the anti-parallel magnetization state. The reduced electron scattering and increased mean free paths effectively cause a reduction in the resistance between terminals 38 and 40 (i.e., a low resistance state). Similarly, when the GMR device is in an anti-parallel magnetization state, electron scattering may increase, and mean free paths for the electrons may decrease causing an increase in the resistance between terminals 38 and 40 (i.e., a high resistance state).

If magnetoresistive device 30 is an MTJ or TMR device, then a parallel magnetization state may increase the likelihood of electrons tunneling through barrier layer 34. The increased likelihood of tunneling effectively causes a reduction in the resistance between terminals 38 and 40 (i.e., a low resistance state). Similarly, when the MTJ or TMR device is in an anti-parallel magnetization state, the likelihood of electrons tunneling through barrier layer 34 may decrease thereby causing an increase in the resistance between terminals 38 and 40 (i.e., a high resistance state).

The magnetization direction of free layer 32, and consequently, the magnetization state of magnetoresistive device 30 may be altered by applying a spin-polarized current having a particular spin direction to one or both of terminals 38 and 40. If the spin direction of the spin-polarized current is in a first direction (e.g., spin-up), then the magnetization direction of free layer 32 may be set to a first direction (e.g., parallel). If the spin direction of the spin-polarized current is in a second direction (e.g., spin-down), then the magnetization direction of free layer 32 may be set to a second direction (e.g., anti-parallel).

The techniques in this disclosure are not limited to the use of magnetoresistive devices as shown and described above with respect to FIGS. 2A-2C. Other known types of magnetoresistive devices may also be used to implement the techniques in this disclosure.

Figure 3:
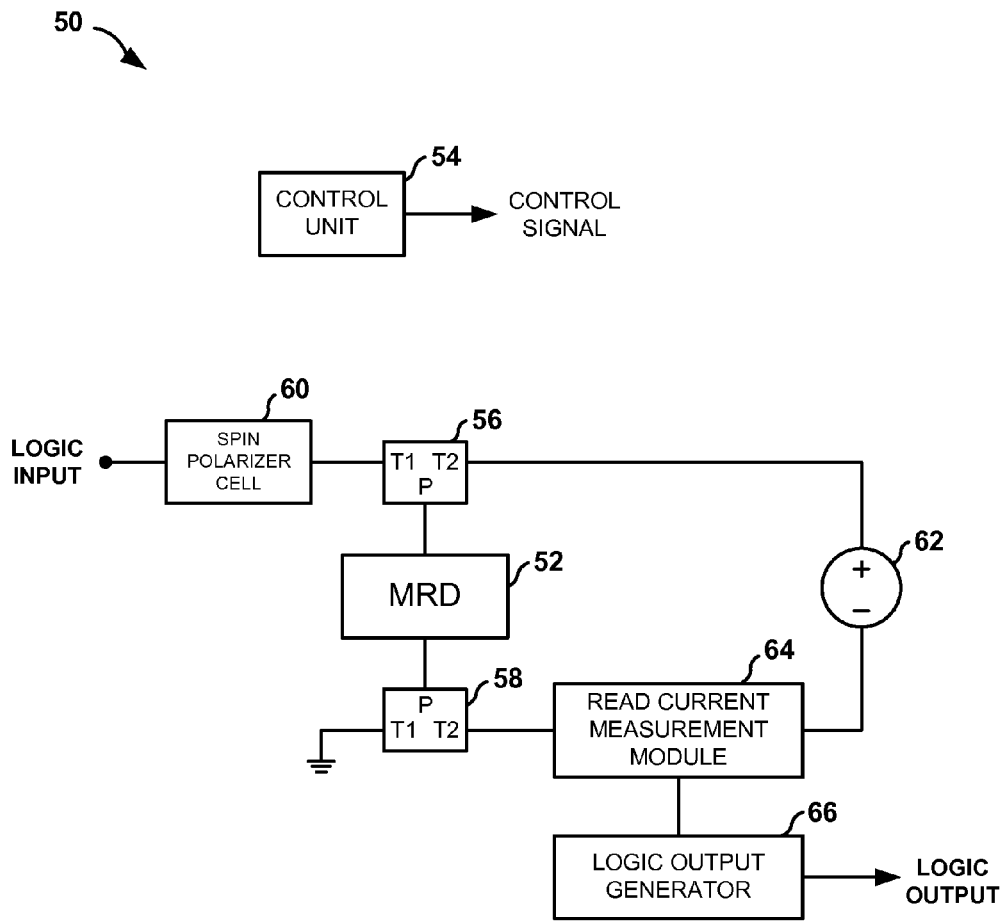
FIG. 3 is a schematic diagram illustrating an example magnetic logic device according to this disclosure.

FIG. 3 is a schematic diagram illustrating an example magnetic logic device 50 according to this disclosure. Magnetic logic device 50 is configured to receive a logic input value and generate a logic output value in response to receiving the logic input value. Magnetic logic device 50 may perform a logic operation on the logic input value to generate the logic output value, such as, e.g., applying a combinational logic function to the logic input value to generate the logic output value. In some examples, magnetic logic device 50 may be used to form magnetic logic device 10 illustrated in FIG. 1. Magnetic logic device 50 includes a magnetoresistive device (MRD) 52, a control unit 54, switching modules 56, 58, a spin polarizer cell 60, a bias voltage source 62, a read current measurement module 64, and a logic output generator 66.

Magnetic logic device 50 includes several components that are similar to components already described above with respect to magnetic logic device 10 illustrated in FIG. 1. For example, MRD 52 may correspond to magnetoresistive device 12 described above with respect to FIG. 1, and control unit 54 may correspond to control unit 16 described above with respect to FIG. 1. Because MRD 52 and control unit 54 have the same structure and functionality as their corresponding components in FIG. 1, these components will not be described in the interest of brevity and to avoid redundancy.

In some examples, switching modules 56, 58 may be used to form switching circuit 14 described above with respect to FIG. 1. In additional examples, spin polarizer cell 60 may be used to form write circuit 18 described above with respect to FIG. 1. In further examples, bias voltage source 62, read current measurement module 64, and logic output generator 66 may be used to form read circuit 20 described above with respect to FIG. 1.

MRD 52 is configured to store a binary value as a magnetization state within MRD 52, and to vary the resistance between the two terminals based on the magnetization state of MRD 52. MRD 52 may be implemented as any type of magnetoresistive device. For example, MRD 52 may be implemented as a GMR, TMR, and/or MTJ device in accordance with the example magnetoresistive device illustrated in FIGS. 2A-2C. A first terminal of MRD 52 is electrically coupled to switching module 56, and a second terminal of MRD 52 is electrically coupled to switching module 58.

The free layer and fixed layer of MRDs 52, 54 may be oriented in several possible orientations. For example, the first and second terminals of MRD 52 may correspond to free layer terminal 38 and fixed layer terminal 40, respectively, of MRD 30 shown in FIGS. 2A-2C. In other examples, the first and second terminals of MRD 52 may correspond to fixed layer terminal terminals 40 and free layer terminal 38, respectively, of MRD 30 shown in FIGS. 2A-2C.

Control unit 54 is configured to provide a control signal indicative of the current operating state of magnetic logic device 10. The control signal may be used to control the configuration of switching modules 56, 58. The control signal may be a single bit indicating either a "Write" state (e.g., logic zero) or a "Read" state (e.g., logic one). Control unit 54 is communicatively coupled to switching modules 56, 58.

Switching modules 56, 58 are configured to receive the control signal from control unit 54, and to configure magnetic logic device 50 into a write configuration or a read configuration based on the control signal. Switching modules 56 and 58 are each communicatively coupled to control unit 54.

Switching module 56 includes a first throw (T1) terminal that is electrically coupled to a spin-polarized current output terminal of spin polarizer cell 60, a second throw (T2) terminal that is electrically coupled to a positive terminal of bias voltage source 62, and a pole (P) terminal that is electrically coupled to a first terminal of MRD 52. Switching module 58 includes a T1 terminal that is electrically coupled to a ground terminal, a T2 terminal that is electrically coupled to a first terminal of read current measurement module 64, and a P terminal that is electrically coupled to a second terminal of MRD 52. Although the T1 terminal of switching module 58 is depicted in the example magnetic logic device 50 of FIG. 3 as being directly coupled to the ground terminal, in other examples, any number of intervening components and/or load networks may be placed between the ground terminal and the T1 terminal of switching module 58.

If the control signal indicates that the current operating state for magnetic logic device 50 is a "Write" state, then switching modules 56, 58 may electrically couple the respective T1 terminals to respective P terminals for each of switching modules 56, 58 and decouple respective T2 terminals from respective P terminals for each of switching modules 56, 58 thereby placing magnetic logic device 50 into a write configuration. On the other hand, if the control signal indicates that the current state for magnetic logic device 50 is a "Read" state, then switching modules 56, 58 may electrically couple respective T2 terminals to respective P terminals for each of switching modules 56, 58 and decouple respective T1 terminals from respective P terminals for each of switching modules 56, 58 thereby placing magnetic logic device 50 into a read configuration.

Spin polarizer cell 60 is configured to receive a logic input value for a combinational logic function, and to generate a spin-polarized current having a spin direction that corresponds to the logic input value of the combinational logic function. Spin polarizer cell 60 may generate a spin-polarized current at a spin-polarized current output terminal that is electrically coupled to the T1 terminal of switching module 56. Spin polarizer cell 60 is further configured to apply the spin-polarized current to MRD 52 to program the magnetization state of MRD 52 when magnetic logic device 50 is operating in a "Write" state.

Bias voltage source 62 is configured to apply a bias voltage across MRD 52 when magnetic logic device 50 is operating in a "Read" state. As shown in FIG. 3, read current measurement module 64 may propagate the voltage applied by bias voltage source 62 to the second terminal of MRD 52. The bias voltage may induce a read current to flow through magnetoresistive device 12.

In some examples, the magnitude of the read current may be less than the magnitude of the spin-polarized current applied to MRD 52 by spin-polarizer cell 60. In further examples, the magnitude of the read current may be less than the minimum magnitude of current needed to change the magnetization state of MRD 52. Because the resistance of MRD 52 is dependent upon the magnetization state of MRD 52, the magnitude of the read current is also dependent on the magnetization state of MRD 52. Hence, the magnitude of the read current may be indicative of the magnetization state of MRD 52.

Bias voltage source 62 includes a first terminal (e.g., a positive terminal) that is electrically coupled to the T2 terminal of switching module 56, and a second terminal (e.g., a negative terminal) that is electrically coupled to a second terminal of read current measurement module 64. Bias voltage source 62 may be configured to regulate the voltage between the first and second terminals at a constant voltage.

It should be noted that the configuration of bias voltage source 62 illustrated in magnetic logic device 50 of FIG. 3 is merely one example. In general, bias voltage source 62 may have positive and negative terminals configured in any manner that allows for a bias voltage to be applied across MRD 52. For example, the negative terminal of bias voltage source 62 may be electrically coupled to a conductor located between MRD 52 and read current measurement module 64. As another example, the positive and negative terminals of bias voltage source 62 may be electrically coupled to opposite terminals of MRD 52 such that the bias voltage is not applied through switches 56 and 58. Other examples are also possible.

Read current measurement module 64 is configured to generate an electrical signal indicative of a magnitude of read current induced in MRD 52 in response to the voltage applied by bias voltage source 62. The electrical signal may be either a current-mode signal or a voltage-mode signal having a magnitude indicative of the programmed magnetization state of MRD 52.

In some examples, the electrical signal may be the read current itself. In additional examples, read current measurement module 64 may perform current-to-voltage conversion on the read current to provide a voltage-mode signal having a magnitude indicative of the magnitude of the read current. For example, read current measurement module 64 may include a transimpedance amplifier that is configured to generate a voltage-mode signal having a voltage magnitude indicative of the magnetization state of MRD 52. In such examples, the current-to-voltage converter may be electrically coupled in series with bias voltage source 62.

Read current measurement module 64 includes a first terminal that is electrically coupled to the T2 terminal of switching module 58, and a second terminal that is electrically coupled to a negative terminal of bias voltage source 62. Read current measurement module 64 may be configured to measure the current fed into the first terminal of read current measurement module 64, which may correspond to the read current propagating through MRD 52. Read current measurement module 64 also includes a third terminal that is electrically coupled to logic output generator 66 and configured to provide the electrical signal indicative of the magnitude of the read current to logic output generator 66.

In some examples, read current measurement module 64 may provide the read current directly to logic output generator 66. In other examples, read current measurement module 64 may convert the read current to a voltage-mode signal having a voltage magnitude indicative of the magnetization state of MRD 52, and provide the voltage mode signal to logic output generator 66. p Logic output generator 66 is configured to receive the electrical signal from read current measurement module 66, and generate a logic output value for the combinational logic function based on the electrical signal. The logic output value corresponds to a logic value (e.g., a binary one or zero) obtained when the combinational logic function is applied to the logic input value. Logic output generator 66 is electrically coupled to read current measurement module 64.

In some examples, logic output generator 66 may include an analog-to-digital converter that is configured to convert the magnitude of the electrical signal into a digital logic output value. For example, the analog-to-digital converter may be implemented as a comparator that compares the magnitude of the electrical signal to the magnitude of a reference electrical signal to determine a logic output value. In any case, logic output generator 66 generates a logic output value corresponding to the combinational logic function applied to the logic input.

During operation, magnetic logic device 50 switches between a write configuration and a read configuration at the direction of control unit 54. A single logic operation may include writing the logic input value to MRD 52 when magnetic logic device 50 is operating in the write configuration. The single logic operation may also include reading of the magnetization state and generating a logic output value when magnetic logic device 50 is operating in the read configuration.

Figure 4A:
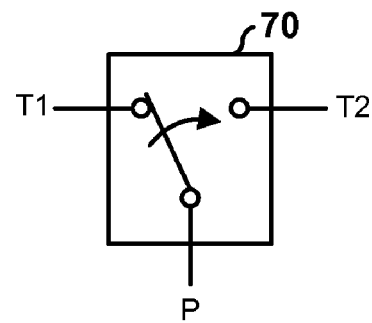
FIGS. 4A and 4B are schematic diagrams illustrating example switching modules for use in the magnetic logic device of FIG. 3 according to this disclosure.
Figure 4B:
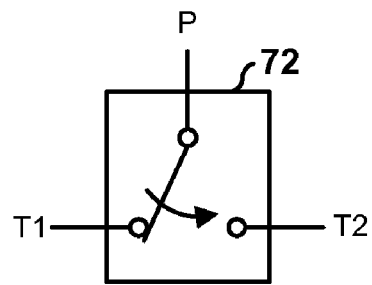

FIGS. 4A and 4B are schematic diagrams illustrating example switching modules 70, 72 for use in the magnetic logic device of FIG. 3 according to this disclosure. As shown in examples of FIGS. 4A and 4B, switching modules 70, 72 are implemented as single-pole double-throw (SPDT) switches. During a first switching state, switching modules 70, 72 electrically couple respective T1 terminals to respective P terminals and decouple respective T2 terminals from respective P terminals. During a second switching state, switching modules 70, 72 electrically couple respective T2 terminals to respective P terminals and decouple respective T1 terminals from respective P terminals. In other examples, switching modules 70, 72 may be implemented as "on-off-on" switches where switching modules 70, 72 may be set to a third switching state that decouples both the T1 terminals from the P terminals and the T2 terminals from the P terminals.

Figure 5:
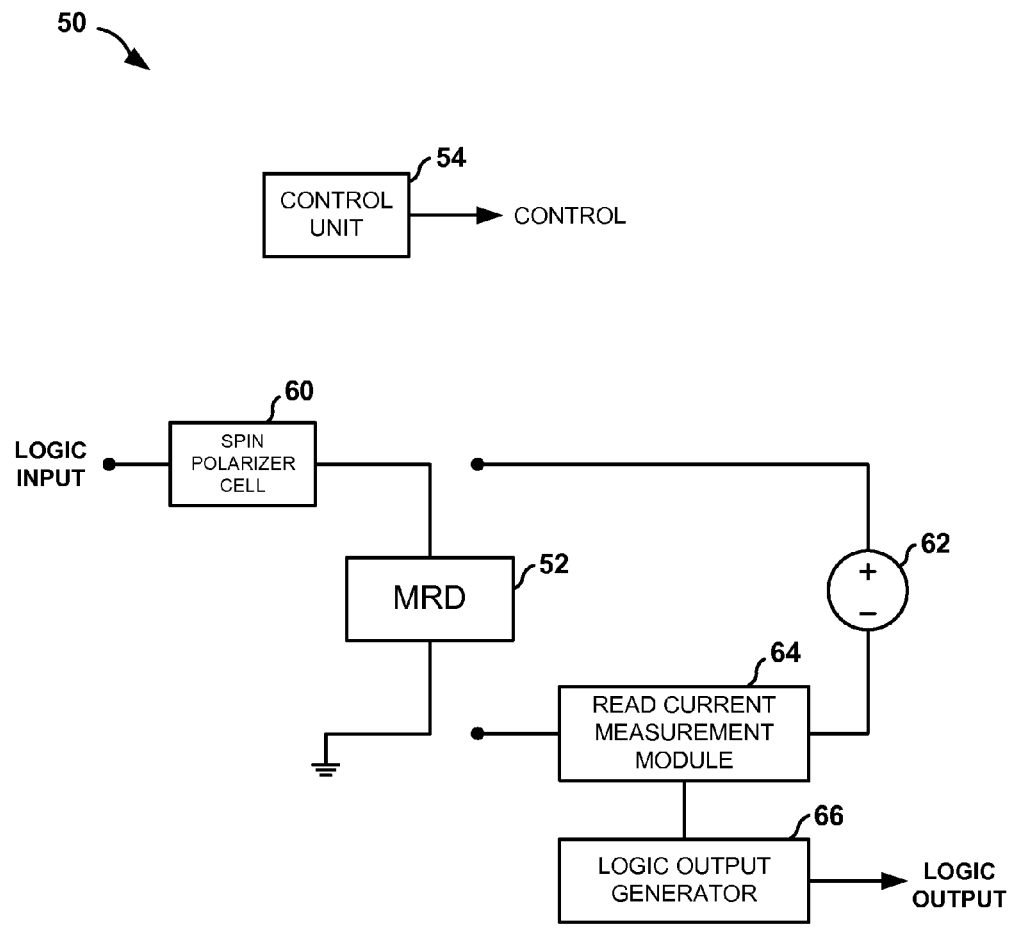
FIG. 5 is a schematic diagram illustrating the magnetic logic device of FIG. 3 configured in a write configuration according to this disclosure.

FIG. 5 is a schematic diagram illustrating the magnetic logic device 50 of FIG. 3 in a write configuration according to this disclosure. As shown in FIG. 5, when magnetic logic device 50 is placed in the write configuration, the write circuit is electrically coupled to MRD 52, and the read circuit is decoupled from MRD 52. More specifically, the spin-polarized current output terminal of spin-polarizer cell 60 is electrically coupled to a first terminal of MRD 52, and a ground terminal is electrically coupled to a second terminal of MRD 52.

While operating in the write configuration, spin polarizer cell 60 may apply a first spin polarized current to MRD 52 such that a resulting magnetization state of MRD 52 corresponds to a logic input value for the logic input. As used herein, a magnetization state of an MRD may correspond to a logic input value when the MRD is placed into one of two magnetization states (e.g., parallel vs. anti-parallel) depending on the value of the logic input (e.g., logic "0" or logic "1").

Figure 6:
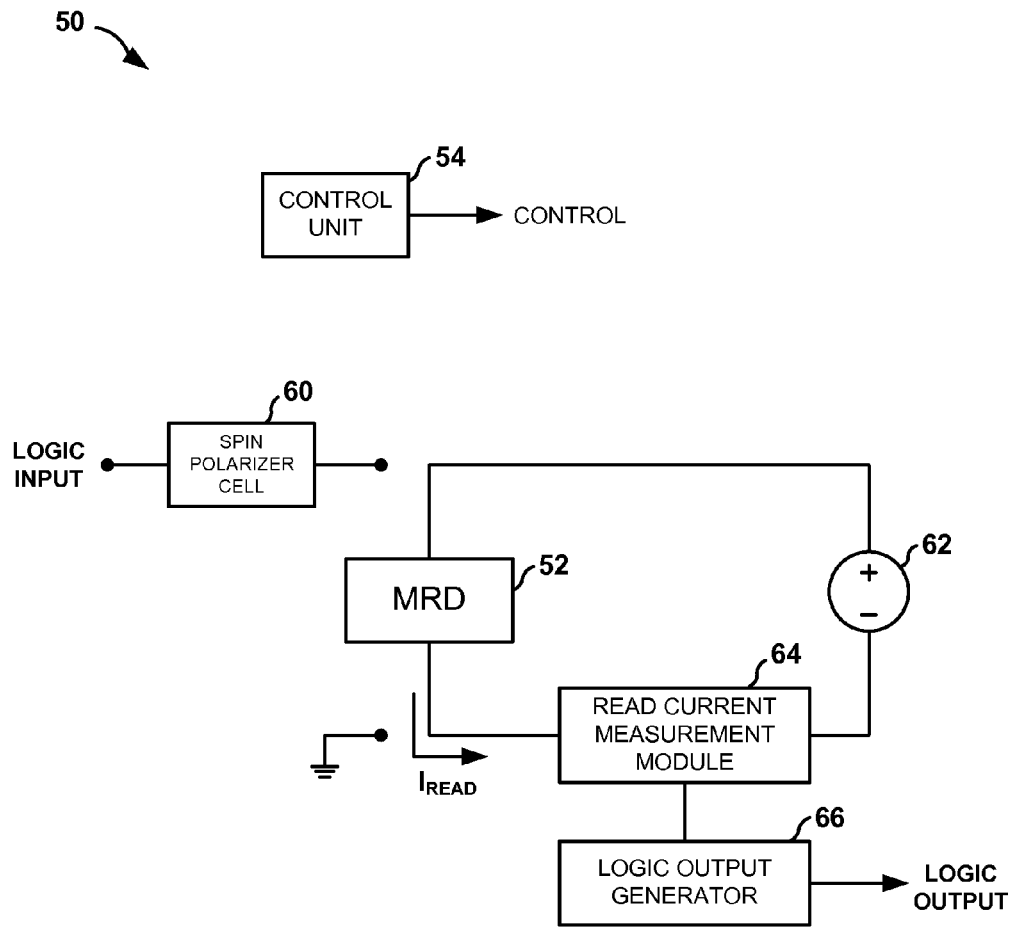
FIG. 6 is a schematic diagram illustrating the magnetic logic device of FIG. 3 configured in a read configuration according to this disclosure.

FIG. 6 is a schematic diagram illustrating the magnetic logic device 50 of FIG. 3 in a read configuration according to this disclosure. As shown in FIG. 6, when magnetic logic device is placed in the read configuration, the read circuit is electrically coupled to MRD 52, and the write circuit is decoupled from MRD 52. More specifically, a first terminal of the bias voltage source is electrically coupled to a first terminal of MRD 52, and a first terminal of read current measurement module is electrically coupled to a second terminal of MRD 52.

While operating in the read configuration, bias voltage source 62 may apply a bias voltage between the free layer terminal and the fixed layer terminal of MRD 52. As shown in FIG. 6, the application of the bias voltage to one of the terminals may involve allowing the voltage to propagate through read current measurement module 64.

In response to the bias voltage being applied across the chain of MRDs, a read current ($I_{READ}$) may be induced in the loop formed by bias voltage source 64, MRD 52 and read current measurement module 64. The magnitude of the read current may be indicative of the magnetization state of MRD 52. Read current measurement module 54 may generate an electrical signal indicative the magnitude of the read current, and logic output generator 66 may generate a logic output value based on the electrical signal.

Figure 7A:
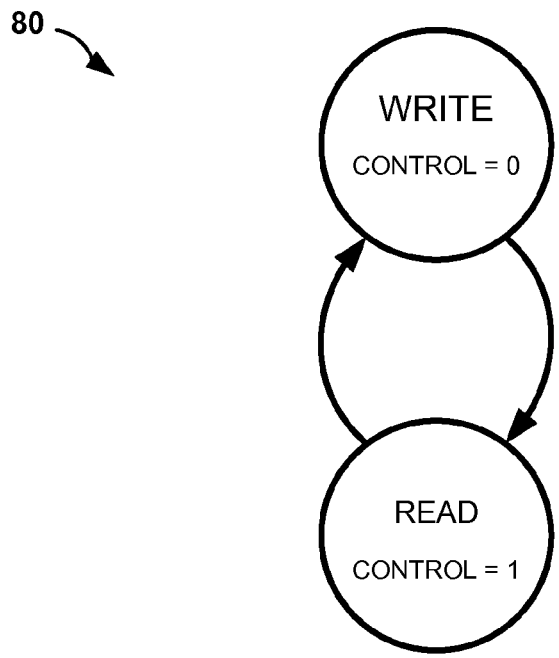
FIG. 7A is a state transition diagram illustrating an example implementation of a control unit for use in the magnetic logic devices of FIGS. 1 and 3 according to this disclosure.

FIG. 7A is a state transition diagram 80 illustrating an example implementation of a control unit for use in the magnetic logic devices 10 and 50 of FIGS. 1 and 3 according to this disclosure. For purposes of explanation, state transition diagram 80 will be described with respect to control unit 54 of FIG. 3.

State transition diagram 80 includes a Write state and a Read state. Control unit 54 may initialize into the Write state. During the Write state, control unit 54 may cause a write circuit formed by spin polarizer cell 60 to apply a spin-polarized current to MRD 52 such that a resulting programmed magnetization state of MRD 52 corresponds to a logic input value of a combinational logic function implemented by magnetic logic device 10. For example, control unit 54 may generate a logic zero control signal, which may be used to control switching modules 56, 58 to switch magnetic logic gate 50 into a write configuration (e.g., couple the T1 terminals to respective P terminals). In some examples, when operating in the Write State, control unit 54 may automatically select the Read state as the next state. In other words, the selection of the Read state as the next state may be independent of any external input received by control unit 54.

Control unit 54 may receive a timing signal that causes control unit 54 to initiate the transition from the Write state to the Read state. In some examples, the timing signal may be a clock signal, and control unit 54 may transition to the next state when control unit 54 when a particular signal condition occurs in the clock signal (e.g., a positive transition, negative transition, positive level, negative level, etc.). In additional examples, the timing signal may not be a clock signal, but may be a timing signal that is activated by an external device. In any case, the timing signal may be used by control unit 54 to determine when to transition from the Write state to the Read state, but not necessarily used to determine to which particular state to transition.

During the Read state, control unit 54 may cause a read circuit formed by bias voltage source 62, read current measurement module 64, and logic output generator 66 to generate a logic output value for the combinational logic function based on the programmed magnetization state of MRD 52. For example, control unit 54 may generate a logic one control signal, which may be used to control switching modules 56, 58 to configure magnetic logic device 50 into a read configuration (e.g., couple the T2 terminals to the respective P terminals). In some examples, when operating in the Read State, control unit 54 may automatically select the Write state as the next state. In other words, the selection of the Write state as the next state may be independent of any external input received by control unit 54. The timing signal may again be used to cause control unit 54 to initiate the transition from the Read state to the Write state.

As shown in FIG. 7A, control unit 54 may successively switch between the Write state and the Read state to continuously perform logic operations. The performance of a single logic operation may include the traversal of both the Write state and the Read state in automatic succession, i.e., switching magnetic logic device 50 into a write configuration and switching MRD 12 into a read configuration in response to switching magnetic logic device 50 into a write configuration.

Figure 7B:
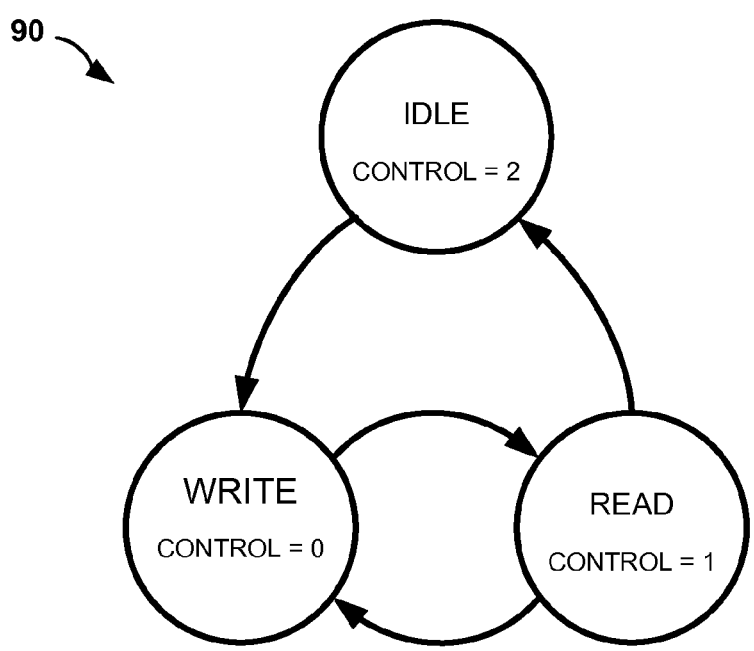
FIG. 7B is a state transition diagram illustrating another example implementation of a control unit for use in the magnetic logic devices of FIGS. 1 and 3 according to this disclosure.

FIG. 7B is a state transition diagram 90 illustrating another example implementation of a control unit for use in the magnetic logic devices 10 and 50 of FIGS. 1 and 3 according to this disclosure. For purposes of explanation, state transition diagram 90 will be described with respect to control unit 54 of FIG. 3.

State transition diagram 90 is similar to state transition diagram 80 of FIG. 7A except that state transition diagram 90 includes a third Idle state. The Idle state may correspond to a power-down state and/or a standby state. During operation, control unit 54 may initialize into the Idle state. While operating in the Idle state, control unit 54 may generate a control signal having a value of two (e.g., logic "10").

In some examples, while operating in the Idle state, control unit 54 may cause the write circuit and the read circuit in the magnetic logic device to power-down. In additional examples, the magnetic logic device may include "on-off-on" SPDT switching modules 56, 58. In such examples, while operating in the Idle state, control unit 54 may cause the "on-off-on" switching modules 56, 58 to switch to an off state where magnetic logic device 50 is neither in a write configuration nor a read configuration, i.e., neither a write circuit nor a read circuit is electrically coupled to MRD 52.

Control unit 54 may receive both a timing signal and an idle signal. The idle signal may indicate whether magnetic logic device 50 should be performing a logic operation or idling. Control unit 54 may remain in the Idle state when the idle signal indicates that magnetic logic device 50 should be idling. When the idle signal indicates that magnetic logic device 50 should be performing a logic operation, then control unit 54 may transition to the Write state.

After transitioning to the Write state, control unit 54 may perform logic operations by successively switching between the Write state and the Read state as long as the idle signal indicates that magnetic logic device 50 should be performing logic operations. When the Idle signal indicates that magnetic logic device 50 should be idling, control unit 54 may transition from the Read state back to the Idle state.

Figure 8:
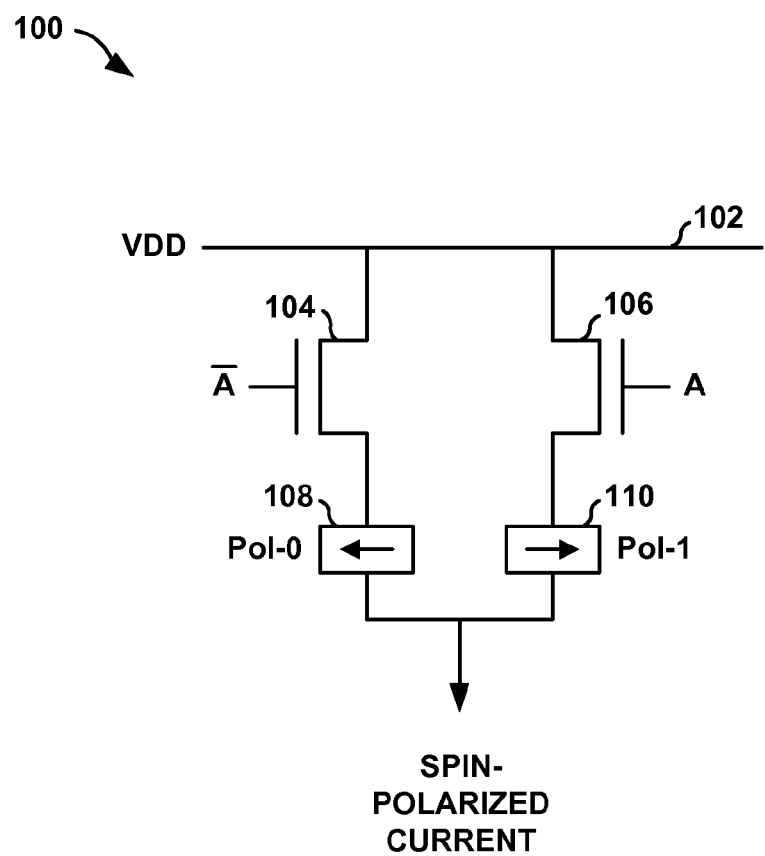
FIG. 8 is a schematic illustrating an example spin polarizer cell for use within the magnetic logic devices of FIGS. 1 and 3 according to this disclosure.

FIG. 8 is a schematic illustrating an example spin polarizer cell 100 for use within the magnetic logic devices of FIGS. 1 and 3. Spin polarizer cell 100 is configured to receive a logic input value for a combinational logic function, and to generate a spin-polarized current having a spin direction that corresponds to the logic input value of the combinational logic function. Spin polarizer cell 100 includes a voltage supply line 102, transistors 104, 106, and spin filters 108, 110.

Transistor 104 includes a source terminal electrically coupled to supply line 102, a drain terminal electrically coupled to spin filter 108, and a gate terminal electrically coupled to a complemented version of the logic input signal (i.e., $\overline{A}$). Transistor 106 includes a source terminal electrically coupled to supply line 102, a drain terminal electrically coupled to spin filter 110, and a gate terminal electrically coupled to an un-complemented version of logic input signal (i.e., A).

Spin filters 108, 110 are configured to receive a current from transistors 104, 106 and to generate a spin-polarized current. The spin direction of the spin-polarized current is determined by the type of spin filter. For example, spin filter 108 is a spin-down type spin filter configured to generate a spin-polarized current having a spin-down spin direction. Similarly, spin filter 110 is a spin-up type spin filter configured to generate a spin-polarized current having a spin-up spin direction.

Spin filter 108 includes an input terminal electrically coupled to the drain of transistor 104, and an output terminal electrically coupled to the spin-polarized current output terminal of spin polarizer cell 100. Spin filter 110 includes an input terminal electrically coupled to the drain of transistor 106, and an output terminal electrically coupled to the spin-polarized current output terminal of spin polarizer cell 100.

Spin filters 108, 110 may include a ferromagnetic material configured to polarize the spin direction (e.g., angular momentum) of the electrons passing through the ferromagnetic material into one of two spin directions (i.e., spin-up or spin-down). Ferromagnetic materials used to implement spin filters 108, 110 may include iron, nickel, cobalt, binary or ternary alloys of the preceding metals, or the like. As shown in FIG. 8, spin filter 108 is configured to polarize the electrons into a spin-down spin direction indicated by the left-hand arrow, and spin filter 110 is configured to polarize the electrons into a spin-up pattern as indicated by the right hand arrow.

During operation, spin polarizer cell 100 receives a logic input value, and in some examples, the complement of the logic input value. If the complement of the logic input value is not received, then spin polarizer cell 100 may generate the complemented version of the logic input value.

If the logic input value is a logic zero, then transistor 104 supplies a current to spin filter 108 and transistor 106 does not supply current (or a negligible amount of current) to spin filter 110. Spin filter 108 polarizes the current to generate a spin-polarized current with a spin-down spin direction (i.e., Pol-0).

Similarly, if the logic input value is a logic one, then transistor 104 does not supply current (or a negligible amount of current) to spin filter 108 and transistor 106 supplies a current to spin filter 108 to spin filter 110. Spin filter 110 polarizes the current to generate a spin-polarized current with a spin-up spin direction (i.e., Pol-1).

Figure 9:
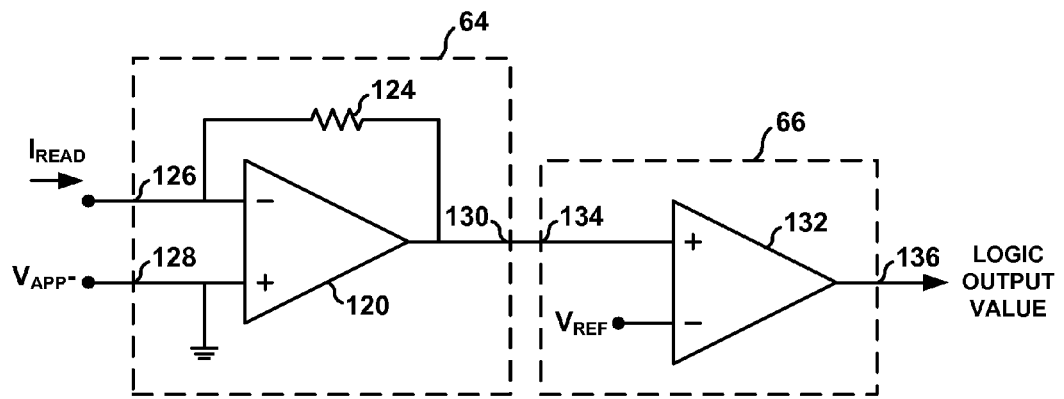
FIG. 9 is a schematic illustrating an example read current measurement module and logic output generator for use within the magnetic logic device of FIG. 3 according to this disclosure.

FIG. 9 is a schematic illustrating an example read current measurement module 64 and logic output generator 66 for use within the magnetic logic device of FIG. 3. Read current measurement module 64 includes an operational amplifier 120, a resistor 124, and terminals 126, 128, 130. Terminal 126 is electrically coupled to an inverting input of operational amplifier 120 and to a first terminal of resistor 124. Terminal 128 is electrically coupled to a non-inverting input of operational amplifier 120, and may be electrically coupled to a ground terminal. Terminal 130 is electrically coupled to the output of operational amplifier 120 and to a second terminal of resistor 124.

Logic output generator 66 includes operational amplifier 136 and terminals 134, 136. Terminal 134 is electrically coupled to a non-inverting input of operational amplifier 132, and terminal 136 is electrically coupled to an output of operational amplifier 132. The inverting input of operational amplifier 132 may be electrically coupled to a reference voltage ($V_{REF}$). Output terminal 130 of read current measurement module may be electrically coupled to input terminal 134 of logic output generator 66.

Terminal 126 of read current measurement module 64 is configured to receive the read current ($I_{READ}$) from MRD 52. Terminal 126 may be electrically coupled to a terminal of MRD 12 via switching module 58. In some examples, terminal 128 of read current measurement module 64 may be electrically coupled to a terminal of bias voltage source 62. In additional examples, terminal 128 may be coupled to a ground terminal and not to other portions of magnetic logic device 50.

The operation of read current measurement module 64 and logic output generator 66 shown in FIG. 9 will now be described. Read current measurement module 64 receives a read current via terminal 126. When the read current is a low current, then read current measurement module 64 drives the voltage at terminal 130 to a low voltage level with respect to ground. The low voltage level is less than the reference voltage level ($V_{REF}$). Operational amplifier 132 compares the low voltage level to $V_{REF}$, determines that the low voltage level is less than $V_{REF}$, and drives the logic output value at terminal 136 to a low logic level.

When the read current is a high current, then read current measurement module 64 drives the voltage at terminal 130 to a high voltage level with respect to ground. The high voltage level is greater than $V_{REF}$. Operational amplifier 132 compares the high voltage level to $V_{REF}$, determines that the high voltage level is greater than $V_{REF}$, and drives the logic output value at terminal 136 to a high logic level. $V_{REF}$ may be generated, in some examples, using a voltage source.

Figure 10:
FIG. 10 is a truth table illustrating example functionality for the magnetic logic device of FIG. 3 according to this disclosure.

FIG. 10 is a truth table 140 illustrating example functionality for the magnetic logic device 50 of FIG. 3. The "Logic Input Value" column represents a binary logic input value received by spin polarizer cell 60. The "Write Current" column represents the spin-polarization direction for the spin-polarized current generated by spin-polarizer cell 60. The "Resistance" column represents the resistance state (i.e., magnetization state) of MRD 52. The "$I_{Read}$" column represents the relative read current magnitude propagating through MRD 52 in response to a voltage applied by bias voltage source 62. The "Logic Output Value" column represents a binary logic output value generated by logic output generator 66.

As shown in FIG. 10, magnetic logic gate 50 performs a buffer (i.e., identity) combinational logic function. Although truth table 140 illustrates magnetic logic gate 50 acting as a buffer, magnetic logic gate 50 may be modified to act as an inverter and perform an inverter (i.e., complement) combinational logic function by reversing the polarity assignments in either the spin-polarizer cell 60 or the logic output generator 66.

Figure 11:
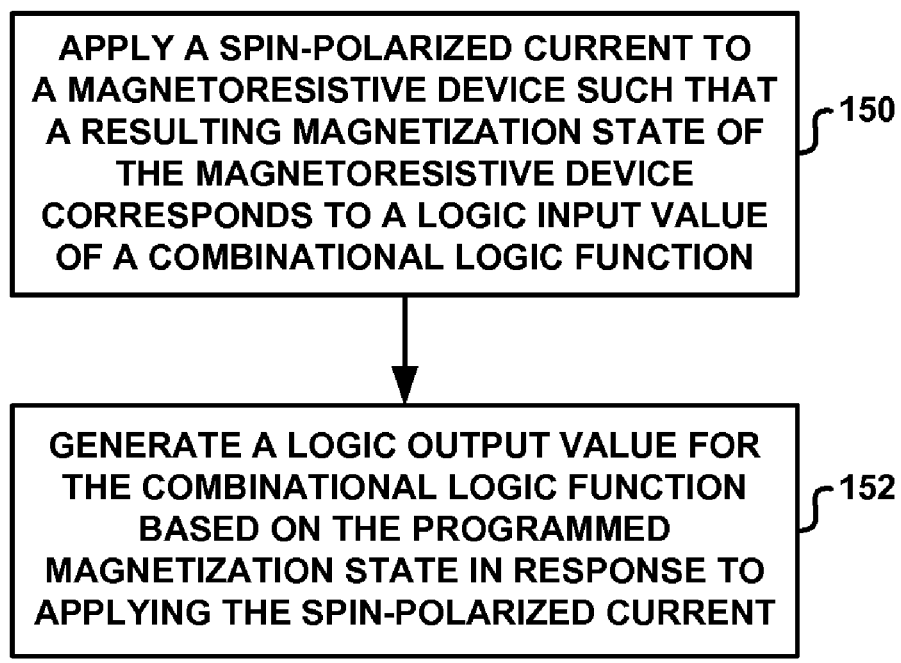
FIG. 11 is a flowchart illustrating an example technique for implementing a logic function with a magnetoresistive device according to this disclosure.

FIG. 11 is a flowchart illustrating an example technique for implementing a logic function with a magnetoresistive device according to this disclosure. In some examples, the technique in FIG. 11 may be used to implement magnetic logic device 10 illustrated in FIG. 1 and/or magnetic logic device 50 illustrated in FIG. 3.

Write circuit 18 applies a spin-polarized current to magnetoresistive device 12 such that a resulting programmed magnetization state of magnetoresistive device 12 corresponds to a logic input value of a combinational logic function (150). Read circuit 20 generates a logic output value for the combinational logic function based on the programmed magnetization state in response to applying the spin-polarized current (152).

Figure 12:
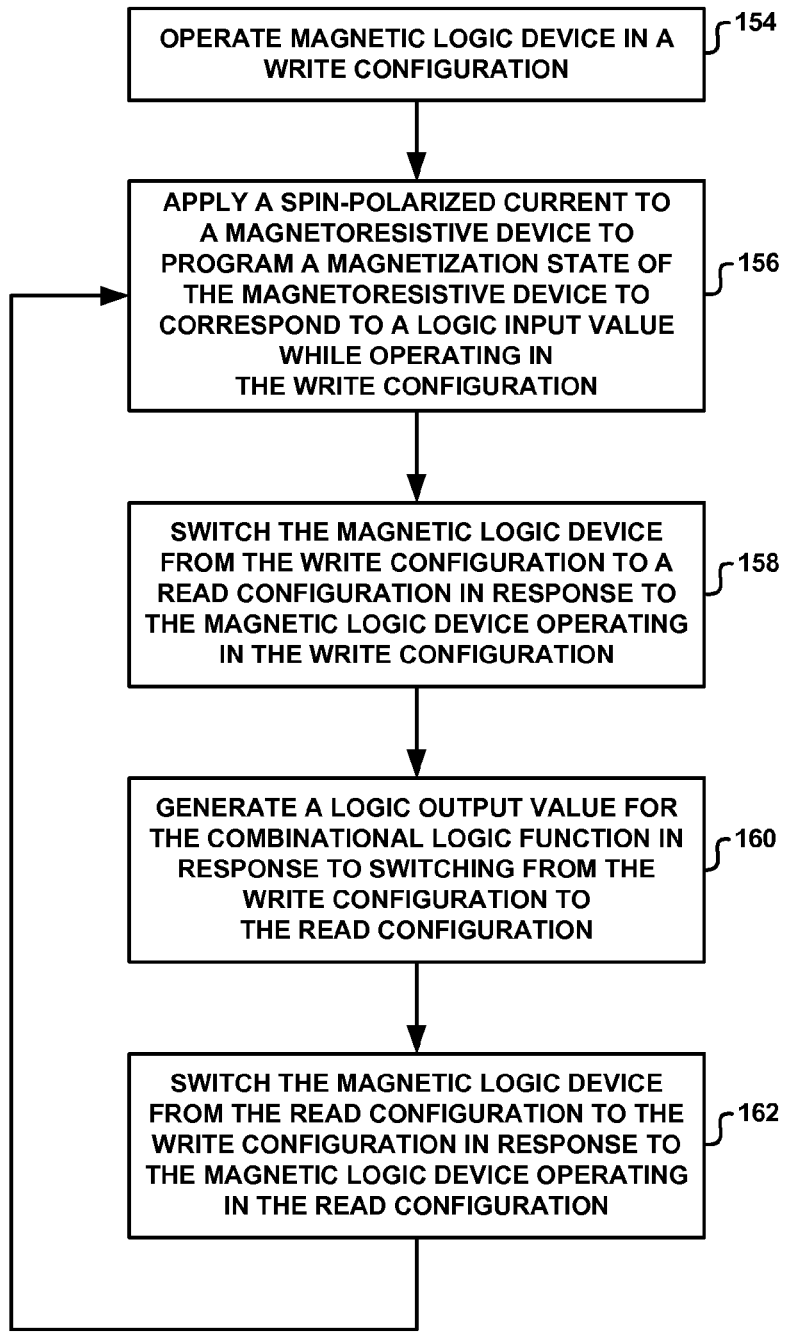
FIG. 12 is a flowchart illustrating another example technique for implementing a logic function with a magnetoresistive device according to this disclosure.

FIG. 12 is a flowchart illustrating another example technique for implementing a logic function with a magnetoresistive device according to this disclosure. In some examples, the technique in FIG. 12 may be used to implement magnetic logic device 10 illustrated in FIG. 1 and/or magnetic logic device 50 illustrated in FIG. 3.

The technique illustrated in FIG. 12 may, in some examples, be used to implement the technique illustrated in FIG. 11. For example, process box 156 may correspond to process box 150 illustrated in FIG. 11, and process boxes 158 and 160 may correspond to process box 152 illustrated in FIG. 11.

Magnetic logic device 10 may operate in a write configuration (154). For example, control unit 16 may switch to a "Write" state and cause switching circuit 14 to switch magnetic logic device 10 to switch into a write configuration (e.g., the configuration illustrated in FIG. 5). While operating in the write configuration, write circuit 18 may apply a spin-polarized current to magnetoresistive device 12 to program a magnetization state of magnetoresistive device 12 to correspond to a logic input value (156).

In response to operating in the write configuration, switching circuit 14 may switch the magnetic logic device from the write configuration to a read configuration (158). For example, control unit 16 may transition from a "Write" state to a "Read" state in response to operating in the "Write" state. While operating in the "Read" state, control unit 16 may direct switching circuit 14 to switch magnetic logic device 10 to a read configuration (e.g., the configuration illustrated in FIG. 6).

In response to switching from the write configuration to the read configuration, read circuit 20 may generate a logic output value for the combinational logic function (160). For example, read circuit 20 may measure the read current propagating through magnetoresistive device 12 in response to an applied voltage and generate a logic output value based on the magnitude of the read current.

In response to the magnetic logic device operating in the read configuration, switching circuit 14 may switch magnetic logic device 10 from the read configuration to the write configuration (162). For example, control unit 16 may transition from a "Read" state to a "Write" state in response to operating in the "Read" state. While operating in the "Write" state, control unit 16 may direct switching circuit 14 to switch magnetic logic device 10 to a write configuration. Magnetic logic gate 10 may proceed to process box 156 to perform subsequent logic operation on subsequent logic input values.

Figure 13:
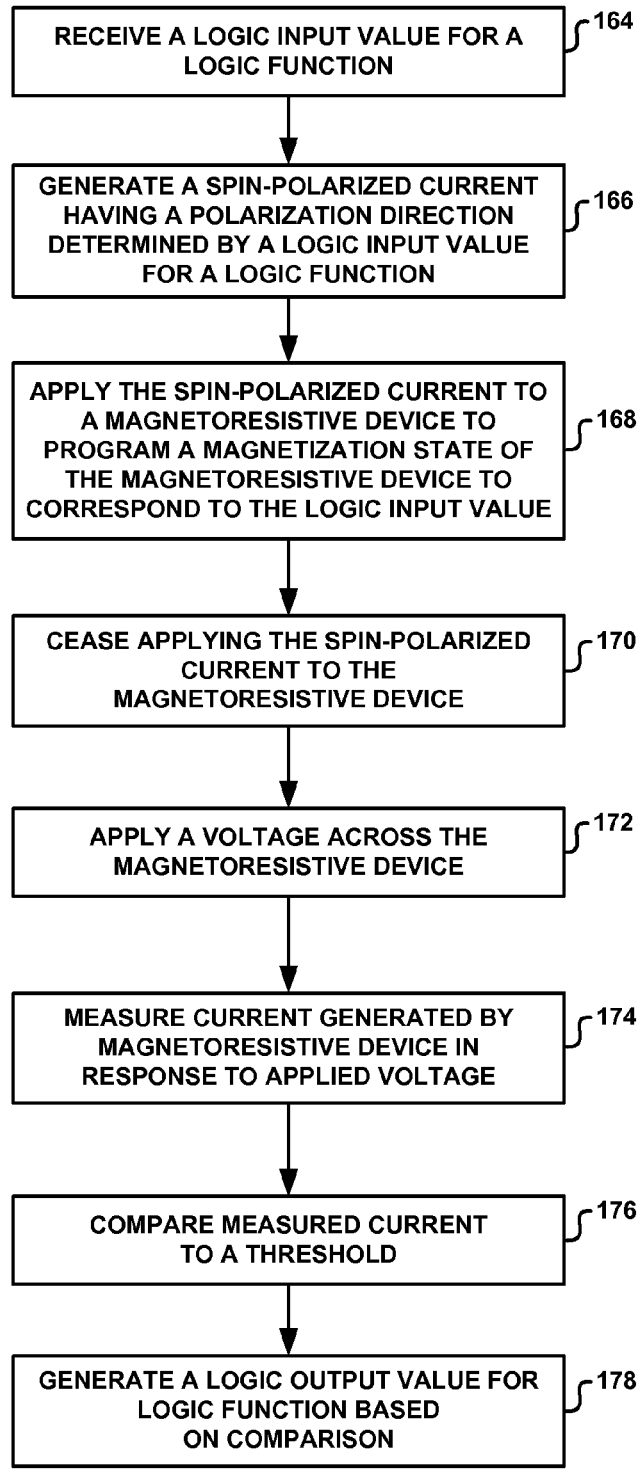
FIG. 13 is a flowchart illustrating another example technique for implementing a logic function with a magnetoresistive device according to this disclosure.

FIG. 13 is a flowchart illustrating another example technique for implementing a logic function with a magnetoresistive device according to this disclosure. In some examples, the technique in FIG. 13 may be used to implement magnetic logic device 10 illustrated in FIG. 1 and/or magnetic logic device 50 illustrated in FIG. 3.

The technique illustrated in FIG. 13 may, in some examples, be used to implement the techniques illustrated in FIGS. 11 and/or 12. For example, process boxes 164, 166 and 168 may correspond to process box 150 illustrated in FIG. 11 or to process box 156 illustrated in FIG. 12. In additional examples, process boxes 172, 174, 176, 178 may correspond to process box 152 illustrated in FIG. 11 or to process box 160 illustrated in FIG. 12.

Spin polarizer cell 60 receives a logic input value for a logic function (164), generates a spin-polarized current having a polarization direction determined by a logic input value for a logic function (166), and applies the spin-polarized current to MRD 52 to program a magnetization state of MRD 52 to correspond to the logic input value (168). Prior to applying the spin-polarized current, control unit 54 may direct switching modules 56, 58 to configure magnetic logic device 50 into a write configuration. After programming the magnetization state MRD 52, spin polarizer cell 60 ceases to apply the spin-polarized current to MRD 52 (170).

Prior to proceeding to block 172, control unit 54 may direct switching modules 56, 58 to configure magnetic logic device 50 into a read configuration. Bias voltage source 62 applies a voltage across the magnetoresistive device 12 (172). Read current measurement module 64 measures the read current generated by MRD 52 (e.g., propagating through MRD 52) in response to the applied voltage (174). Logic output generator 66 compares the measured current to a threshold (176), and generates a logic output value for logic function based on the comparison (178).

The techniques described herein may be able to produce integrated circuits having lower power consumption and/or increased chip density in comparison to integrated circuits that implement equivalent logic using a CMOS process technology. In contrast to transistor-based CMOS logic gates, the magnetic logic gates designed in accordance with this disclosure may be non-volatile, i.e., such gates may retain their state even if the logic gate is not receiving power. In addition, the techniques in this disclosure may be able to be monolithically integrated with conventional CMOS electronics.

The circuit components described in this disclosure can be implemented as discrete components, as one or more integrated devices, or any combination thereof. The circuit components described herein may be fabricated using any of a wide variety of process technologies including CMOS process technologies. In addition, the circuitry described herein may be used in various applications including telecommunications applications, general computing application, or any application that utilizes a clock generation and distribution system.

Various aspects of the disclosure have been described. These and other aspects are within the scope of the following claims.

The invention claimed is:

1. A magnetic logic device comprising:
   a magnetoresistive device;
   a write circuit configured to apply a spin-polarized current to the magnetoresistive device such that a resulting programmed magnetization state of the magnetoresistive device corresponds to a logic input value of a combinational logic function implemented by the magnetic logic device; and
   a read circuit configured to generate a logic output value for the combinational logic function based on the programmed magnetization state in response to the write circuit applying the spin-polarized current to the magnetoresistive device.

2. The device of claim 1,
   wherein the write circuit is further configured to apply the spin-polarized current to the magnetoresistive device when the magnetic logic device is operating in a write configuration,
   wherein the device further comprises a switching circuit configured to switch the magnetic logic device from the write configuration to a read configuration in response to the magnetic logic device operating in the write configuration, and
   wherein the a read circuit is further configured to generate the logic output value for the combinational logic function in response to the switching circuit switching the magnetic logic device from the write configuration to the read configuration.

3. The magnetic logic device of claim 2, wherein the switching circuit is further configured to couple the read circuit to the magnetoresistive device and decouple the write circuit from the magnetoresistive device to switch the magnetoresistive device into a read configuration.

4. The magnetic logic device of claim 2, wherein the switching circuit is further configured to automatically switch from the write configuration to the read configuration during the performance of a single logic operation for the combinational logic function.

5. The magnetic logic device of claim 2, wherein the switching circuit is further configured to switch the magnetic logic device from the read configuration to the write configuration in response to the magnetic logic device operating in the read configuration.

6. The magnetic logic device of claim 1,
   wherein the logic input value is a first logic input value for a first logic operation, the spin-polarized current is a first spin-polarized current, the resulting programmed magnetization state is a first resulting programmed magnetization state, and the logic output value is a first logic output value for the first logic operation,
   wherein the write circuit is further configured to apply a second spin-polarized current to the magnetoresistive device such that a resulting programmed magnetization state of the magnetoresistive device corresponds to a second logic input value for a second logic operation in response to the read circuit generating the first logic output value, and
   wherein the read circuit is further configured to generate a second logic output value for the second logic operation based on the programmed magnetization state in response to the write circuit applying the second spin-polarized current to the magnetoresistive device.

7. The magnetic logic device of claim 1,
   wherein the write circuit comprises:
      a spin polarizer cell configured to generate the spin-polarized current such that the spin-polarized current has a spin direction corresponding to the logic input value of the combinational logic function, and
   wherein the read circuit comprises:
      a bias voltage source configured to apply a bias voltage across the magnetoresistive device;
      a read current measurement module configured to measure a read current generated by the magnetoresistive device in response to the bias voltage being applied across the magnetoresistive device; and
      a logic output generator configured to compare the measured current to a threshold, and generate a logic output value based on the comparison.

8. The magnetic logic device of claim 1, wherein the combinational logic function comprises at least one of a buffer combinational logic function and an inverter combinational logic function.

9. The magnetic logic device of claim 1, wherein the magnetoresistive device comprises at least one of a giant magnetoresistance (GMR) device, a magnetic tunnel junction (MTJ) device, and a tunneling magnetoresistance (TMR) device.

10. The magnetic logic device of claim 1, further comprising:
    a control unit configured to cause the write circuit to apply the spin-polarized current to the magnetoresistive device such that a resulting programmed magnetization state of the magnetoresistive device corresponds to the logic input value of the combinational logic function, and to cause, in response to causing the write circuit to apply the spin-polarized current, a read circuit to generate a logic output value for the combinational logic function based on the programmed magnetization state.

11. A method comprising:
    applying a spin-polarized current to the magnetoresistive device such that a resulting programmed magnetization state of the magnetoresistive device corresponds to a logic input value of a combinational logic function; and
    generating a logic output value for the combinational logic function based on the programmed magnetization state in response to applying the spin-polarized current to the magnetoresistive device.

12. The method of claim 11, further comprising:
    operating a magnetic logic device in a write configuration,
    wherein applying the spin-polarized current to the magnetoresistive device comprises applying the spin-polarized current to the magnetoresistive device when the magnetic logic device is operating in the write configuration,
    wherein the method further comprises switching the magnetic logic device from the write configuration to a read configuration in response to the magnetic logic device operating in the write configuration, and
    wherein generating the logic output value for the combinational logic function comprises generating the logic output value for the combinational logic function in response to switching the magnetic logic device into the read configuration.

13. The method of claim 12, wherein switching the magnetic logic device from the write configuration to the read configuration comprises:

coupling the read circuit to the magnetoresistive device; and decoupling the write circuit from the magnetoresistive device.

14. The method of claim 12, wherein switching the magnetic logic device from the write configuration to the read configuration comprises:

automatically switching from the write configuration to the read configuration during the performance of a single logic operation for the combinational logic function.

15. The method of claim 12, switching the magnetic logic device from the read configuration to the write configuration in response to the magnetic logic device operating in the read configuration.

16. The method of claim 11, further comprising:

generating the spin-polarized current such that the spin-polarized current has a spin direction corresponding to the logic input value of the combinational logic function;

applying a bias voltage across the magnetoresistive device;

measuring a read current generated by the magnetoresistive device in response to the bias voltage being applied across the magnetoresistive device;

comparing the measured current to a threshold; and generating a logic output value based on the comparison.

17. The method of claim 11, further comprising:

causing, with a control unit, a write circuit to apply the spin-polarized current to the magnetoresistive device such that the resulting programmed magnetization state of the magnetoresistive device corresponds to the logic input value of a combinational logic function; and causing, in response to causing the write circuit to apply the spin-polarized current, a read circuit to generate the logic output value for the combinational logic function based on the programmed magnetization state.

18. The method of claim 11, wherein the combinational logic function comprises at least one of a buffer combinational logic function and an inverter combinational logic function.

19. The method of claim 11, wherein the magnetoresistive device comprises at least one of a giant magnetoresistance (GMR) device, a magnetic tunnel junction (MTJ) device, and a tunneling magnetoresistance (TMR) device.

20. A magnetic logic device comprising:

a magnetoresistive device;

a control unit configured to cause a write circuit to apply a spin-polarized current to the magnetoresistive device such that a resulting programmed magnetization state of the magnetoresistive device corresponds to a logic input value of a combinational logic function implemented by the magnetic logic device, and to cause, in response to causing the write circuit to apply the spin-polarized current, a read circuit to generate a logic output value for the combinational logic function based on the programmed magnetization state.

* * * * *